(12) United States Patent
Amato et al.

(10) Patent No.: US 10,796,756 B2
(45) Date of Patent: *Oct. 6, 2020

(54) PERMUTATION CODING FOR IMPROVED MEMORY CELL OPERATIONS

(71) Applicant: Micron Technology, Inc., Boise, ID (US)

(72) Inventors: Paolo Amato, Treviglio (IT); Marco Sforzin, Cernusco sul Naviglio (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/524,288

(22) Filed: Jul. 29, 2019

(65) Prior Publication Data

US 2019/0355413 A1     Nov. 21, 2019

Related U.S. Application Data

(63) Continuation of application No. 15/957,098, filed on Apr. 19, 2018.

(51) Int. Cl.
*G11C 16/28*    (2006.01)
*G11C 11/56*    (2006.01)
(Continued)

(52) U.S. Cl.
CPC ...... *G11C 11/5678* (2013.01); *G11C 11/1673* (2013.01); *G11C 13/004* (2013.01);
(Continued)

(58) Field of Classification Search
CPC . G11C 11/40; G11C 11/1673; G11C 16/0408; G11C 16/28
See application file for complete search history.

(56) References Cited

U.S. PATENT DOCUMENTS 5,375,094 A    12/1994   Naruke
6,388,908 B1    5/2002    Araki
(Continued)

OTHER PUBLICATIONS

U.S. Appl. No. 15/853,328, filed Dec. 22, 2017, Micron Ref. No. 2017-0496.00/US, 61 pages.
(Continued)

*Primary Examiner* — Jay W. Radke
(74) *Attorney, Agent, or Firm* — Brooks, Cameron & Huebsch, PLLC

(57) ABSTRACT

Permutation coding for improved memory cell operations are described. An example apparatus can include an array of memory cells each programmable to a plurality of states. A controller coupled to the array is configured to determine an encoded data pattern stored by a number of groups of memory cells. Each of the number of groups comprises a set of memory cells programmed to one of a plurality of different collective state permutations each corresponding to a permutation in which the cells of the set are each programmed to a different one of the plurality of states to which they are programmable. The controller is configured to determine the encoded data pattern by, for each of the number of groups, determining the one of the plurality of different collective state permutations to which the respective set is programmed by direct comparison of threshold voltages of the cells of the set.

19 Claims, 13 Drawing Sheets

(51) Int. Cl.
*G11C 13/00* (2006.01)
*G11C 16/04* (2006.01)
*G11C 11/16* (2006.01)

(52) U.S. Cl.
CPC .......... *G11C 16/0408* (2013.01); *G11C 16/28* (2013.01); *G11C 2013/0042* (2013.01); *G11C 2211/5631* (2013.01)

(56) References Cited

U.S. PATENT DOCUMENTS

| | | |
|---|---|---|
| 7,054,197 B2 | 5/2006 | Vimercati |
| 7,321,512 B2 | 1/2008 | Vimercati et al. |
| 7,345,905 B2 | 3/2008 | Pio et al. |
| 7,554,861 B2 | 6/2009 | Vimercati et al. |
| 9,418,745 B1 | 8/2016 | Chen |
| 2002/0171101 A1 | 11/2002 | Hsu |
| 2005/0029505 A1* | 2/2005 | Lowrey .............. G11C 13/0004 257/5 |
| 2014/0071746 A1* | 3/2014 | Jurasek ................ G11C 13/004 365/163 |
| 2016/0372200 A1 | 12/2016 | Li |

OTHER PUBLICATIONS

U.S. Appl. No. 15/853,364, filed Dec. 22, 2017, Micron Ref. No. 2017-1039.00/US, 63 pages.

* cited by examiner

| INPUT BITS (COMPARATOR OUTPUT) | | | COLLECTIVE STATE (PERMUTATION) | OUTPUT BITS | | NOTE |
|---|---|---|---|---|---|---|
| A > B | A > C | B > C | | OUT(0) | OUT(1) | |
| 0 | 0 | 0 | (L, M, H) | 0 | 0 | |
| 0 | 0 | 1 | (L, H, M) | 1 | 0 | |
| 0 | 1 | 0 | — | — | — | INCOHERENT |
| 0 | 1 | 1 | (M, H, L) | 1 | 1 | |
| 1 | 0 | 0 | (M, L, H) | 0 | 1 | |
| 1 | 0 | 1 | — | — | — | INCOHERENT |
| 1 | 1 | 0 | (H, L, M) | — | — | NOT USED |
| 1 | 1 | 1 | (H, M, L) | — | — | NOT USED |

| BITS | 2 | 5 | 7 | 10 | 12 | 15 | 18 | 20 | 23 | 25 | 28 | 31 |
|---|---|---|---|---|---|---|---|---|---|---|---|---|
| CELLS | 3 | 6 | 9 | 12 | 15 | 18 | 21 | 24 | 27 | 30 | 33 | 36 |
| RATE (BIT/CELL) | 0.67 | 0.83 | 0.78 | 0.83 | 0.8 | 0.83 | 0.86 | 0.83 | 0.85 | 0.83 | 0.85 | 0.86 |

FIG. 10

PERMUTATION CODING FOR IMPROVED MEMORY CELL OPERATIONS

PRIORITY INFORMATION

This application is a Continuation of U.S. application Ser. No. 15/957,098, filed on Apr. 19, 2018, the contents of which are incorporated herein by reference.

TECHNICAL FIELD

The present disclosure relates generally to apparatus, such as storage systems, and their operation, and, more particularly, to permutation coding for improved memory cell operations.

BACKGROUND

Storage systems may be implemented in electronic systems, such as computers, cell phones, hand-held electronic devices, etc. Some storage systems, such as solid state drives (SSDs), embedded Multi-Media Controller (eMMC) devices, Universal Flash Storage (UFS) devices, and the like may include non-volatile storage memories for storing user data from a host. Non-volatile storage memories provide persistent data by retaining stored data when not powered and may include NAND flash memory, phase change memory (PCM), resistive random access memory (RRAM), magnetic random access memory (MRAM), and programmable conductive memory, among other types of memory that can be written to a particular number of times throughout their lifetime.

Non-volatile memory cells can be programmed to a desired state. As an example, some memory cells can be programmed to one of multiple states that can correspond to (e.g., be encoded with) different bit patterns. The particular programmed state of a cell can be determined by, for example, comparing the threshold voltage of the cell to a reference voltage In some examples, a threshold voltage (Vt) of a cell can drift, which can make accurate reading difficult since the drift may need to be tracked in order to ensure use of proper demarcation/read voltages.

BRIEF DESCRIPTION OF THE DRAWINGS

FIG. 7 illustrates an example of a table corresponding to read the component in FIG. 6, in accordance with a number of embodiments of the present disclosure.

FIG. 9 illustrates a table that associates code and the combined collective states of two groups of memory cells, in accordance with a number of embodiments of the present disclosure.

FIG. 10 illustrates bit/cell rates of various combinations of bits and memory cells, in accordance with a number of embodiments of the present disclosure.

DETAILED DESCRIPTION

Figure 1:
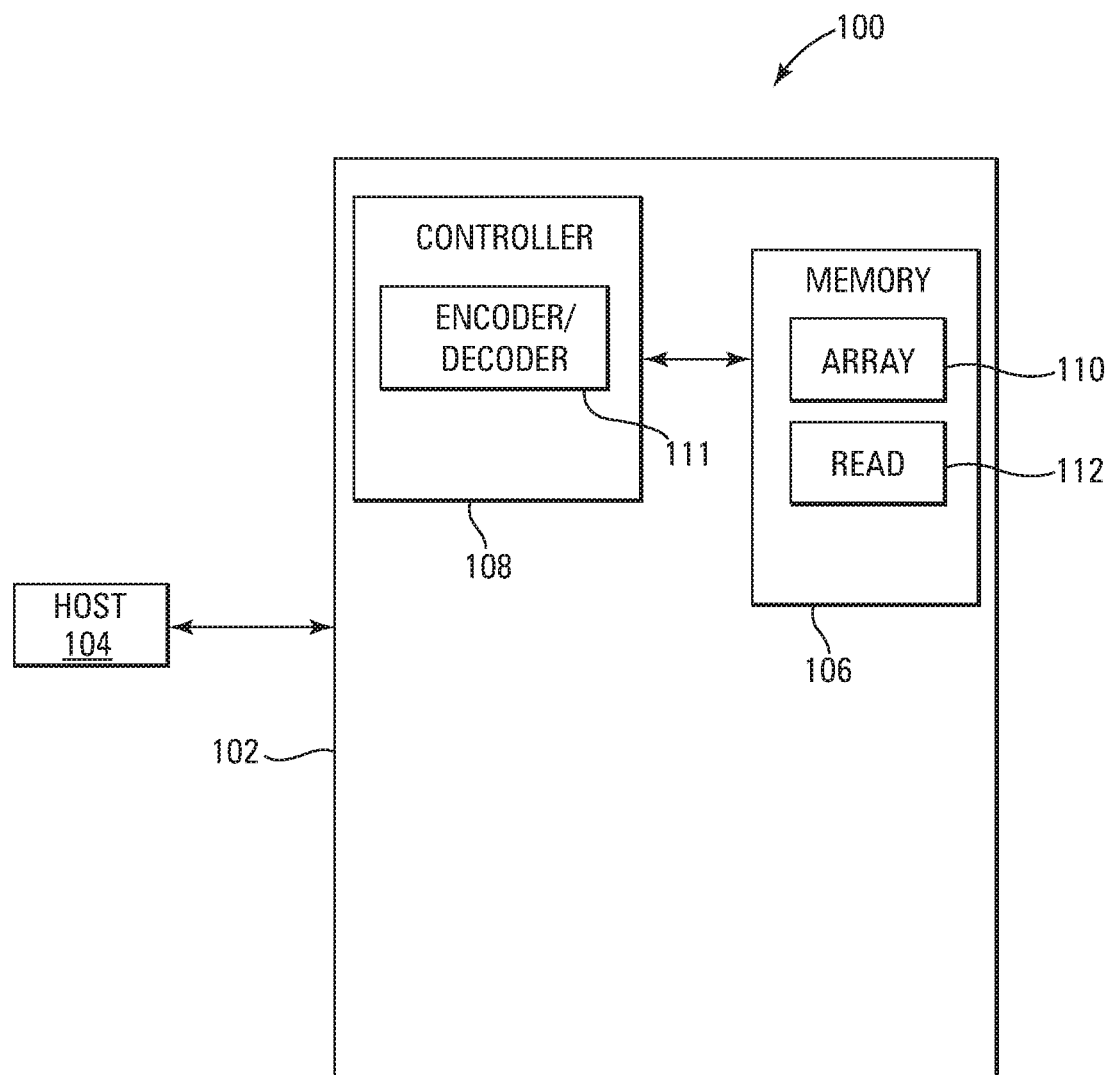
FIG. 1 is a block diagram of an apparatus, in accordance with a number of embodiments of the present disclosure.

Permutation coding for improved memory cell operations are described. An example apparatus can include an array of memory cells each programmable to a plurality of states. A controller coupled to the array is configured to determine an encoded data pattern stored by a number of groups of memory cells. Each of the number of groups comprises a set of memory cells programmed to one of a plurality of different collective state permutations each corresponding to a permutation in which the cells of the set are each programmed to a different one of the plurality of states to which they are programmable. The controller is configured to determine the encoded data pattern by, for each of the number of groups, determining the one of the plurality of different collective state permutations to which the respective set is programmed by direct comparison of threshold voltages of the cells of the set. Such a direct comparison of cell threshold voltages can provide various benefits such as providing an ability to cope with cell threshold voltage drift (e.g., due to time, temperature, cycling, etc.) to obtain reliable data output without having to monitor/track the cell threshold voltage positions.

Embodiments of the present disclosure provide various technical advantages over prior approaches to operating memory cells. For example, one issue associated with various memory cells, such as resistance variable memory cells, is that the cell threshold voltage (Vt) distributions may drift (e.g., move, shift, change) with time, temperature, cycling (e.g., wear), etc. Various read methods may use one or more reference voltages, which may be referred to as "read" voltages or a "demarcation" voltages, to distinguish between stored states (e.g., Vt distributions) of a cell. Accordingly, Vt drift can reduce the ability to reliably determine the stored state of the cell using the demarcation voltages. Some prior approaches include tracking/monitoring the Vt drift such that adjusted demarcation voltages can be used based on the amount of Vt drift. Other approaches may account for Vt drift by requiring a large voltage difference (e.g., window or margin) between Vt distributions. However, such previous approaches can be costly in terms of power usage and/or circuitry complexity, for example.

In contrast, embodiments of the present disclosure capitalize on the fact that relationships between states the memory cells, such as the relationships between the threshold voltages of the memory cells (e.g., the differences between the threshold voltages), may remain the same with temperature and/or age. For example, a collective state of a group of memory cells may be determined based on the relationships between the individual states of the memory cells in the group of memory cells instead of determining the actual individual state of each of the individual states directly using sensing voltages, thereby overcoming the problems associated with drift that may occur when determining the actual individual states using sensing voltages.

FIG. 1 is a block diagram of an apparatus in the form of a computing system 100, in accordance with a number of embodiments of the present disclosure. Computing system 100 includes a memory system 102 that can be, for example, a storage system such as an SSD, a UFS device, an embedded eMMC device, etc. However, embodiments are not limited to a particular type of memory system. For example, memory system 102 could serve as main memory for system 100.

As shown in FIG. 1, the system 102 can include a controller 108 coupled to a memory 106 and host 104. Host 104 can be, for example, a host system such as a personal laptop computer, a desktop computer, a digital camera, a mobile device (e.g., cellular phone), network server, Internet of Things (IoT) enabled device, or a memory card reader, among various other types of hosts. For instance, host 104 can include one or more processors capable of accessing memory 106 (e.g., via controller 108) over an interface, which can include a bus. The interface may be a standardized interface, such as a serial advanced technology attachment (SATA), peripheral component interconnect express (PCIe), or a universal serial bus (USB), among various others.

Memory 106 can comprise a number of memory devices (e.g., memory dies, chips, etc.), which each can comprise a number of arrays 110. The arrays 110 can include two-dimensional (2D) and/or three-dimensional (3D) array structures such as cross point array structures. The memory cells can include, for example, various types of resistance variable (e.g., PCRAM cells, RRAM cells, 3D cross point cells), which may comprise a resistance variable storage element and/or switch element. In a number of embodiments, the memory cells can be self-selecting memory (SSM) cells in which a single material can serve as both the storage element and the memory element.

As an example, the memory cells can be phase change memory (PCM) cells, which can be chalcogenide based memory cells comprising a single chalcogenide material serving as both a storage element and a switch element for the cells and/or a stack of materials with a first chalcogenide material serving as a switch element and a second chalcogenide serving as a storage element for the cells. However, embodiments are not limited to a particular array architecture and/or memory cell type. For instance, the array 110 might comprise NAND flash memory cells and/or NOR flash memory cells, among others.

The memory device 106 includes a read component 112 that can comprise various circuitry associated with operating memory cells in accordance with embodiments of the present disclosure. For example, as described further below, the read component can include sense amplifiers, comparators, and/or combinatorial logic (e.g., logic gates) configured to determine data values stored in memory cells in accordance with an implemented permutation coding of the cells. A number of embodiments rely on direct comparison of cell Vts as opposed to comparing individual cell Vts to a reference voltage, in order to determine the logic output of the cells. Such a direct comparison of cell Vts can provide various benefits such as providing an ability to cope with cell Vt drift (e.g., due to time, temperature, cycling, etc.) to obtain reliable data output without having to monitor/track the cell Vt positions.

Controller 108 can include circuitry that is configured to perform the methods disclosed herein. The controller 108 can comprise, for example, a state machine, a sequencer, and or some other type of control circuitry, and can communicate with the memory devices 106 to control data read, write, and erase operations, among other operations. The controller 108 can include, for example, a number of components in the form of hardware (e.g., one or more integrated circuits) and/or software (e.g., instructions, which may be in the form of firmware) for controlling access to the number of memory devices 106 and/or for facilitating data transfer between the host 104 and memory devices 106. In general, the controller 108 can receive and execute commands from the host 104 to achieve the desired access to the memory 106. The controller 108 can be responsible for, among other things, performing various methods for improved memory operations in accordance with embodiments described herein. For instance, as shown in FIG. 1, the controller 108 can include an encoder/decoder 111 that can be used to map between stored data patterns and collective state permutations, as described further herein.

Figure 2:
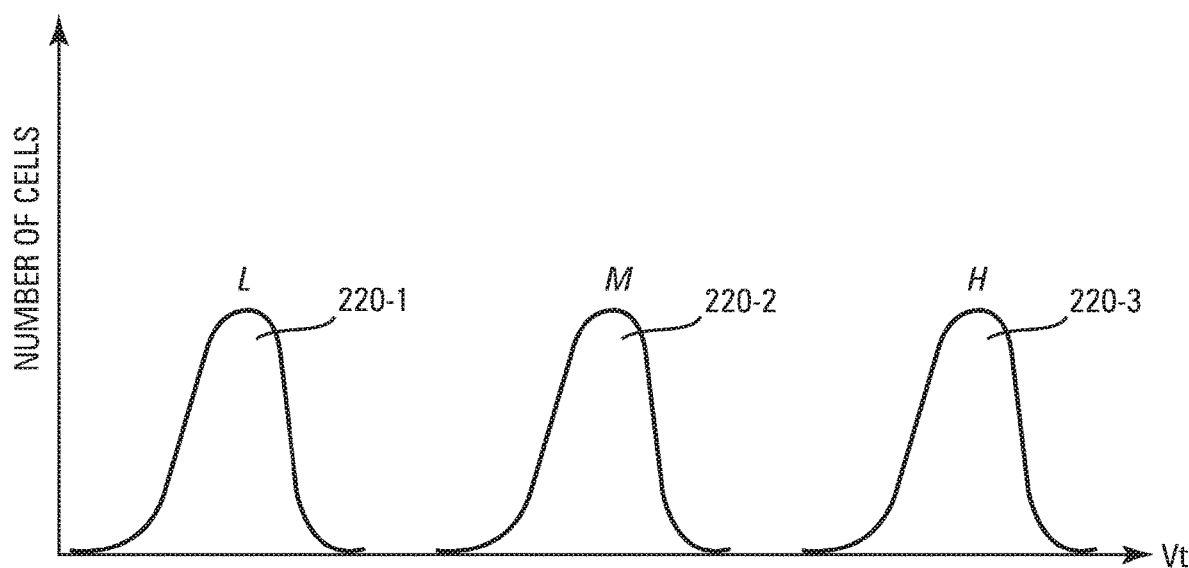
FIG. 2 illustrates an example of threshold voltage distributions corresponding to states to which memory cells can be programmed, in accordance with a number of embodiments of the present disclosure.

FIG. 2 illustrates an example of Vt distributions corresponding to states to which memory cells can be programmed, in accordance with a number of embodiments of the present disclosure. Threshold distributions 220-1, 220-2, and 220-3 respectively correspond to a low state (e.g., Vt level) L, a medium state M, and a high state H. For example, states L, M, and H may respectively correspond to different resistance levels to which the respective corresponding memory cells are programmed.

Figure 3:
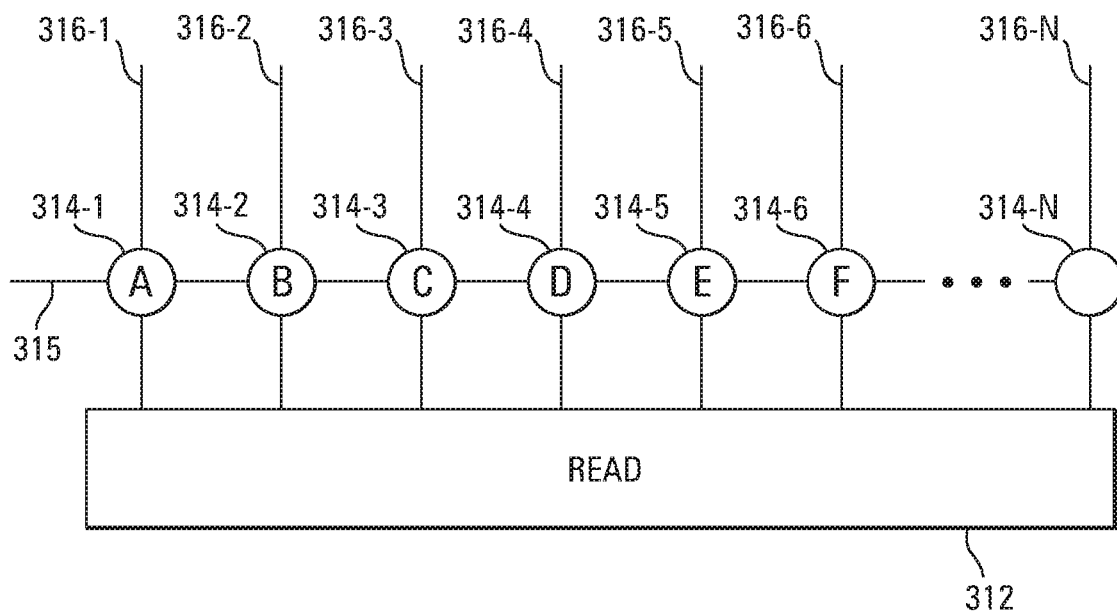
FIG. 3 illustrates an example of a portion of a memory that may be read using the methods disclosed herein, in accordance with a number of embodiments of the present disclosure.

FIG. 3 shows an example of a portion of memory array 110 that may be read using the methods disclosed herein, in accordance with a number of embodiments of the present disclosure. In some examples, a first set of memory cells 314-1 (A), 314-2 (B), and 314-3 (C) may be programmed to a collective state by respectively programming memory cells 314-1 (A), 314-2 (B), and 314-3 (C) to different states. For example, in each collective state, memory cell 314-1 (A) may be programmed to one of the individual states L, M, and H in FIG. 2, memory cell 314-2 (B) another one of the individual states L, M, and H, and memory cell 314-3 (C) yet another one of the individual states L, M, and H. Similarly, the second set of memory cells 314-4 (D), 314-5 (E), and 314-6 (F) may be programmed to a collective state by respectively programming memory cells 314-4 (D), 314-5 (E), and 314-6 (F) to different states, and in each collective state, memory cell 314-4 (D) may be programmed to one of the individual states L, M, and H, memory cell 314-5 (E) another one of the individual states L, M, and H, and memory cell 14-6 (F) yet another one of the individual states L, M, and H. In some examples, the first set and the second set may be included in one of a number of groups of memory cells of memory array 110.

Memory cells 314-1 to 314-N can be cross-point memory cells located at intersections of a signal line 315, such as a word line, and signal lines 316-1 to 316-N, such as bit lines. For instance, memory cells 314-1 (A), 314-2 (B), and 314-3 (C) are respectively coupled to signal lines 316-1, 316-2, and 316-3 and are commonly coupled to signal line 315, and memory cells 314-4 (D), 314-5 (E), and 314-6 (F) are respectively coupled to signal lines 316-4, 316-5, and 316-6 and are commonly coupled to signal line 315. Signal lines 316-1 to 316-N, and thus memory cells 314-1 to 314-N, can be coupled to a read component 312 that can be included in read component 112, for example.

Voltages indicative of the current flows respectively through memory cells 314-1 to 314-N in response to a voltage being applied across memory cells 314-1 to 314-N can be output to read component 312. For example, the voltage outputs may be indicative of the respective states to which memory cells 314-1 to 314-N are programmed. Read component 312 can compare the voltage outputs corresponding to memory cells 314-1 (A), 314-2 (B), and 314-3 (C) to determine relationships between the individual states of memory cells 314-1 (A), 314-2 (B), and 314-3 (C) and the voltage outputs corresponding to memory cells 314-4 (D), 314-5 (E), and 314-6 (F) to determine relationships between the individual states of memory cells 314-4 (D), 314-5 (E), and 314-6 (F).

In some examples, an increasing ramp voltage may be applied to signal line 315 while concurrently applying the voltage (e.g., the same voltage) to signal lines 316-1 to 316-N so that an increasing ramp voltage is applied across memory cells memory cells 314-1 to 314-N. Read component 312 can sense respective switching events, such as thresholding events (e.g., snapback events) of memory cells 314-1 to 314-N in response to applying the ramp voltage across memory cells 314-1 to 314-N. Memory cells 314-1 to 314-N can, for example, respectively switch from one conductivity state, such as a low conductivity state (e.g., high resistive state) to another conductivity state, such as a higher conductivity state, in response to the ramp voltage reaching the respective threshold voltages of memory cells 314-1 to 314-N. Read component 312 can sense the respective switching events by sensing respective changes in current.

In some examples, memory cells 314-1 (A), 314-2 (B), and 314-3 (C) may experience the switching events in timewise order, according to their respective states and threshold voltages, from first to last, as the ramp voltage increases with time. For example, the memory cells may switch in order, starting with the memory cell with lowest state (e.g., lowest threshold voltage) and ending with the memory cell with highest state (e.g., highest threshold voltage) in response to the increasing ramp voltage. Similarly, memory cells 314-4 (D), 314-5 (E), and 314-6 (F) may experience the switching events in order, according to their respective states and threshold voltages, from first to last, as the ramp voltage increases with time.

Memory cells 314 can be, for example, resistance variable memory cells whose respective states (e.g., stored data values) depend on the respective programmed resistances of memory cells. Memory cells 314 can be overwritten individually without first being erased, in some examples.

The number of different collective states to which a setset of three memory cells, such as the first set of memory cells 314-1 (A), 314-2 (B), and 314-3 (C) and the second set of memory cells 314-4 (D), 314-5 (E), and 314-6 (F), may be programmed is the number of permutations of the individual states L, M, and H. In each respective collective state, the respective memory cells of the set of memory cells may be respectively be programmed to the states in a respective permutation. There are six permutations of the states L, M, and H, and thus six different collective states to which the set of memory cells can be programmed, which are: (L, M, H), (L, H, M), (M, L, H), (M, H, L), (H, L, M), and (H, M, L). For example, each respective collective state corresponds to a different one of the six permutations.

In each respective collective state, the memory cells of the sets of three memory cells may be respectively programmed to the respective individual states in each respective corresponding permutation. For example, memory cells 314-1 (A), 314-2 (B), and 314-3 (C) may be respectively programmed to the individual states of permutation (L, M, H), permutation (L, H, M), permutation (M, L, H), permutation (M, H, L), permutation (H, L, M), or permutation (H, M, L). Similarly, memory cells 314-4 (D), 314-5 (E), and 314-3 (F) may be respectively programmed to the individual states of permutation (L, M, H), permutation (L, H, M), permutation (M, L, H), permutation (M, H, L), permutation (H, L, M), or permutation (H, M, L).

The number of bits that can be stored by the respective sets of three memory cells is n=$\log_2$(the number of states) =$\log_2$(6)=2.58 bits. Since this is for a set of three cells, the number of bits per cell is 2.58/3=0.86 bit/cell. This represents the maximum number of bits per cell in the set of three memory cells. However, in some examples, each collective state of the set of cells may correspond to (e.g., may be assigned) a positive integer number of bits. Therefore, the number of bits n corresponding to each collective state is two, since two is the largest positive integer number less than 2.58. This means that the number of bits per cell in the set is 2/3=0.67 bit/cell. Therefore, the number of collective states of the set of cells is $2^n=2^2=4$ states. Therefore, four of the six collective states (e.g., permutations) may be used, and the set of cells may be programmed to one of the four collective states, a subset of the six possible collective states.

Figure 4:
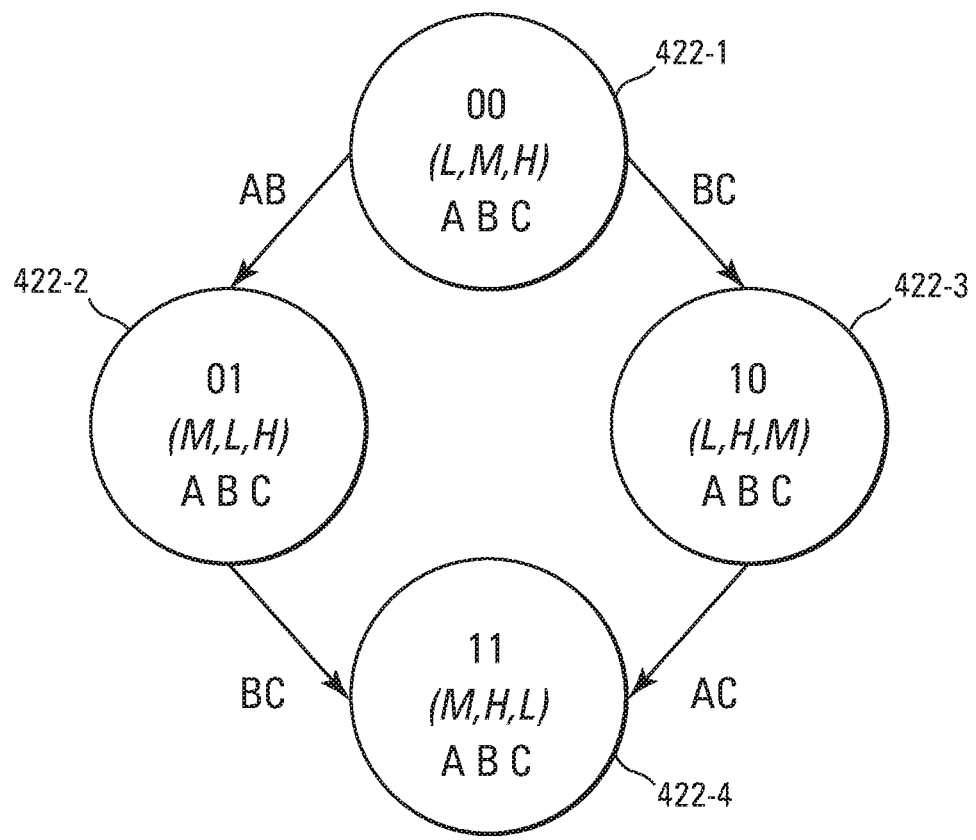
FIG. 4 illustrates different states to which groups memory cells may be programmed and the bits corresponding to each different state, in accordance with a number of embodiments of the present disclosure.

FIG. 4 illustrates the four collective states to which the set memory cells 314-1 (A), 314-2 (B), and 314-3 (C) can be programmed and the bits corresponding to each state, in accordance with a number of embodiments of the present disclosure. FIG. 4 also shows for each collective state the individual states of memory cells 314-1 (A), 314-2 (B), and 314-3 (C) respectively denoted in FIG. 3. Hereinafter, the memory cells 314-1 (A), 314-2 (B), and 314-3 (C) of the first set will be respectively referred to as memory cells A, B, and C, and the memory cells 314-4 (D), 314-5 (E), and 314-6 (F) of the second set will be respectively referred to as memory cells D, E, and F.

Region 422-1 corresponds to collective state (L, M, H) and shows that collective state (L, M, H) corresponds to a quantity of bits, such as a code, 00 and that memory cells A, B, and C are respectively programmed to the individual states L, M, H. Region 422-2 corresponds to collective state (M, L, H) and shows that collective state (M, L, H) corresponds to a code 01 and that memory cells A, B, and C are respectively programmed to the individual states M, L, H. Note that in going from region 422-1 to region 422-2, only one of the bit values changes (e.g., 00 in region 422-1 changes to 01 in region 422-2) and that the single bit change involves swapping the states of two cells (e.g., cells A and B). This is an example of Gray coding and occurs in going from one region to the next in the direction of the arrows in FIG. 4.

For example, region 422-3 corresponds to collective state (L, H, M) and shows that collective state (L, H, M) corresponds to a code 10, that memory cells A, B, and C are respectively programmed to the individual states L, H, M, and that in going from region 422-1 to region 422-3, one bit of 00 in region 422-1 is changed to get 10 in region 422-3 and the states of cells B and C are swapped.

Region 422-4 corresponds to collective state (M, H, L) and shows that collective state (M, H, L) corresponds to a code 11 and that memory cells A, B, and C are respectively programmed to the individual states M, H, L. Note that in going from region 422-2 to 422-4, one bit of 01 in region 422-2 is changed to get 11 in region 422-4 and the states of cells B and C are swapped. In going from region 422-3 to 422-4, one bit of 10 in region 422-3 is changed to get 11 in region 422-4 and the states of cells A and C are swapped. Note that in example of FIG. 4, the collective states H, L, M and H, M, L are not used.

Figure 5:
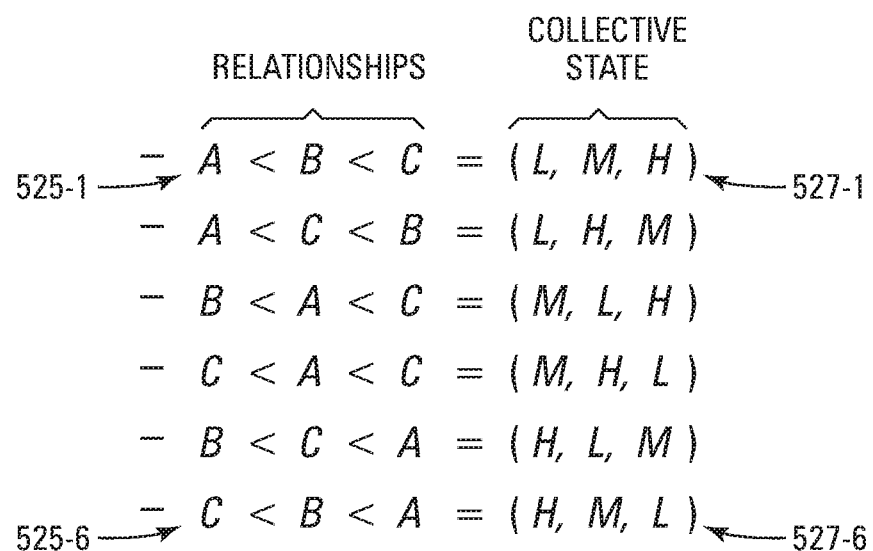
FIG. 5 is an example illustrating relationships between individual states of a group of memory cells, in accordance with a number of embodiments of the present disclosure.

Read component 112 may determine the collective states from the relationships between the individual states of the collective states. FIG. 5 is an example illustrating relationships 525, such as inequalities, between the individual states of the memory cells A, B, and C corresponding to each collective state 527, in accordance with a number of embodiments of the present disclosure. For example, relationships 525-1 to 525-6 respectively correspond to collective states 527-1 to 527-6. This may apply to the first and second sets of memory cells previously described. Read component 112 may determine the relationships between individual threshold states shown in FIG. 5, in order determine the corresponding collective state.

Figure 6:
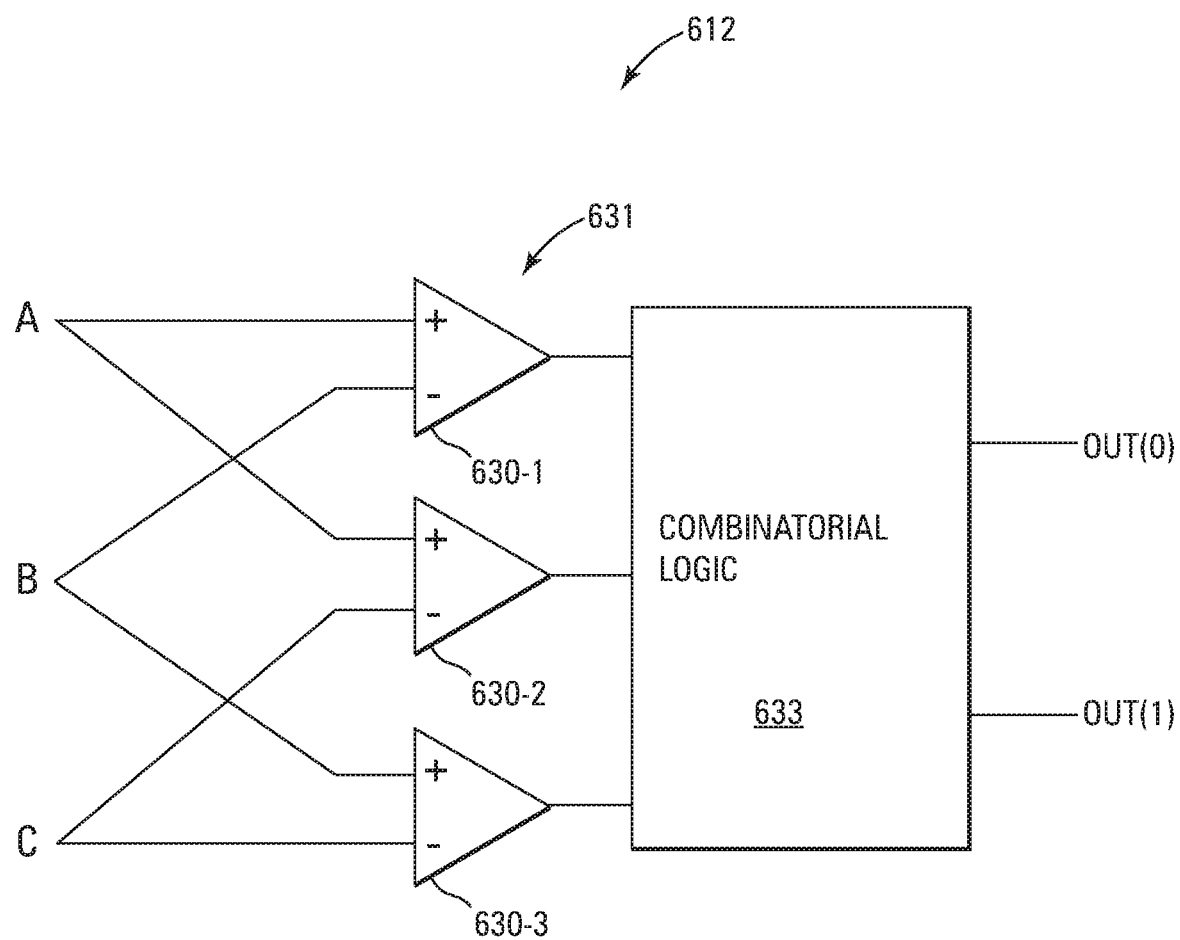
FIG. 6 illustrates an example of a read component, in accordance with a number of embodiments of the present disclosure.

FIG. 6 illustrates an example of a read component 612 that can be a portion of read component 112, in accordance with a number of embodiments of the present disclosure. Read component 612 includes a set 631 of comparators 630-1 to 630-3 having outputs coupled to combinatorial logic 633. Each comparator 630 can determine a relationship between the states of two of the memory cells A, B, and C of the first set of memory cells by comparing the individual states of the two memory cells, and can output an indication of the relationship to combinatorial logic 633. For example, each comparator may determine inequalities between the states of the memory cells being compared, such as whether one of the memory cells is at a higher state than the other. Combinatorial logic 633 determines the collective state based on (e.g., responsive to) the outputs of the comparators and assigns a code (e.g., that includes two bits) to the determined collective state. For example, the outputs out(0) and out(1) of combinatorial logic 633 correspond to the two bits.

Inputs of comparator 630-1 are coupled to memory cells A and B; inputs of comparator 630-2 are coupled to memory cells A and C; and inputs of comparator 630-3 are coupled to memory cells B and C. Comparator 630-1 compares (e.g., senses a difference between) the states of memory cells A and B to determine a relationship between the states of memory cells A and B and outputs an indication of the relationship to combinatorial logic 633. Comparator 630-2 compares the states of memory cells A and C to determine a relationship between the states of memory cells A and C and outputs an indication of the relationship to combinatorial logic 633. Comparator 630-3 compares the states of memory cells B and C to determine a relationship between the states of memory cells B and C and outputs an indication of the relationship to combinatorial logic 633.

In some examples, the inputs to the comparators may receive voltages indicative of the states of memory cells A, B, and C. For example, the inputs respectively corresponding to memory cells A, B, and C can be voltages. As such, the comparators can compare the voltages. The set 631 of comparators may determine relationships (e.g., inequalities) between memory cells A, B, and C by sensing differences between the voltages corresponding to memory cells A, B, and C. For example, the respective voltages may correspond to the respective states of memory cells A, B, and C, such as the respective programmed resistances (e.g., respective threshold voltages) of memory cells A, B, and C.

FIG. 7 illustrates an example of a table 739 corresponding to read component 112, read component 312, and/or read component 612, in accordance with a number of embodiments of the present disclosure. For example, table 739 can be a look-up table implemented by combinatorial logic 633. Table 739 may have sets of inputs, corresponding to sets of outputs from the set 631 of comparators, and the outputs out(0) and out(1). Rows 740-1 to 740-8 show the respective outputs out(0) and out(1) for each respective set of inputs from comparators 630-1 to 630-3.

Region 742 illustrates the sets of inputs from the set 631 of comparators. For example, each set of inputs is a set of relationships between the states of memory cells A, B, and C. A binary 0 in the portions of the rows 740-1 to 740-8 corresponding to region 742 indicates that the corresponding one of the inequalities A>B, A>C, and B>C is false, and a binary 1 indicates that the corresponding one of the inequalities A>B, A>C, and B>C is true.

Region 744 illustrates the assignment of the respective collective states by combinatorial logic 633 to the respective sets of inputs from the set 631 of comparators. For example, each collective state in region 744 corresponds to a respective set of relationships in region 742. Region 746 illustrates the respective outputs of combinatorial logic 633 (e.g., the binary code) corresponding to the respective collective states in region 744, and thus the respective relationships in region 742.

In some examples, a combined collective state may correspond to one of the six possible collective states of the first set of memory cells A, B, and C combined with one of the six possible collective states of the second set of memory cells D, E, and F. For example, there may be 36 such combined collective states.

However, in some examples, each combined collective state may correspond to a positive integer number of bits. Therefore, the number of bits n corresponding to each combined collective state is 5, since $2^5=32$ states is the largest number of states less than 36 states. This means that the number of bits per cell in the combined first and second sets is $5/6=0.83$ bit/cell, which is greater than and closer to the maximum of 0.86 bit/cell than the 0.67 bit/cell for the first set or second set alone.

Figure 8:
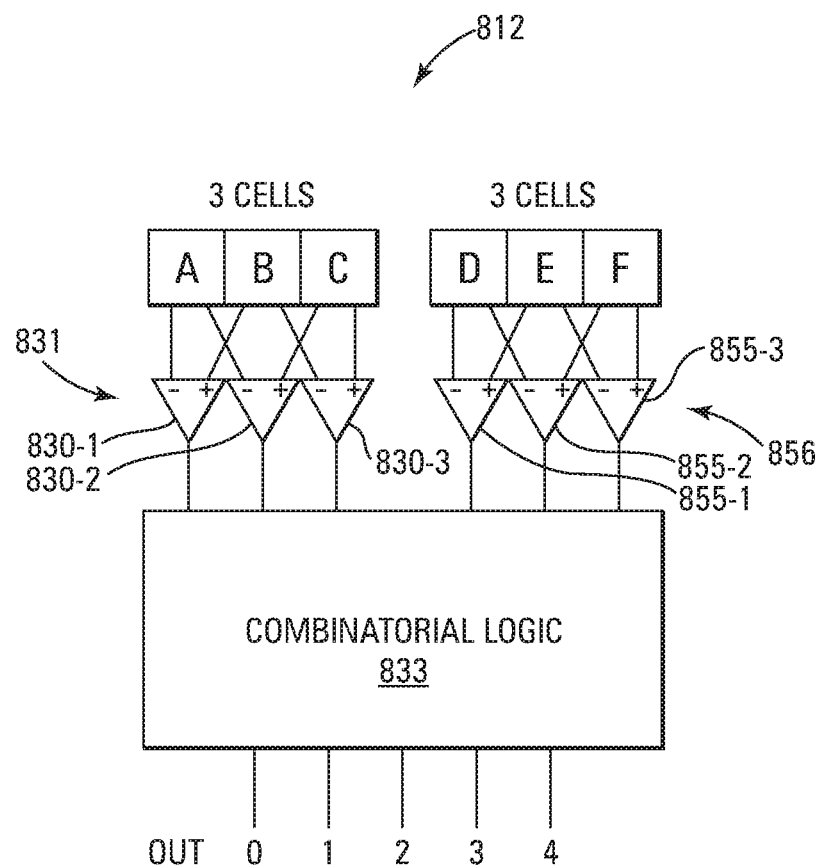
FIG. 8 illustrates another example of a read component, in accordance with a number of embodiments of the present disclosure.

FIG. 8 illustrates an example of a read component 812 that can be a portion of read component 112 and/or read component 312, in accordance with a number of embodiments of the present disclosure. Read component 812 includes two sets of comparators, such as set 831 and set 856 having outputs coupled to combinatorial logic 833. For example, set 831 includes comparators 830-1 to 830-3, and set 856 includes comparators 855-1 to 855-3.

Each comparator 830 can determine a relationship, such as an inequality, between the states of two of the memory cells A, B, and C of the first set of memory cells, by comparing the individual states of the two memory cells, and can output an indication of the relationship (e.g., the collective state) to combinatorial logic 833. Each comparator 855 can determine a relationship between the states of two of the memory cells D, E, and F of the second set of memory cells, by comparing the individual states of the two memory cells, and can output an indication of the relationship to combinatorial logic 833. Combinatorial logic 833 combines the two collective states to obtain the combined collective states and assigns a code (e.g., that includes five bits) to the determined collective state. For example, the outputs 0 to 4 of combinatorial logic 833 correspond to the five bits.

Comparators 830-1, 830-2, and 830-3 respectively compare the states of memory cells A and B, A and C, and B and C. For example, comparators 830-1, 830-2, and 830-3 may respectively compare the voltages corresponding memory cells A and B, memory cells A and C, and memory cells B and C of FIG. 3. Comparators 855-1, 855-2, and 855-3 respectively compare the states of memory cells D and E, D and F, and E and F. For example, comparators 855-1, 855-2, and 855-3 may respectively compare the voltages corresponding to memory cells D and E, memory cells D and F, and memory cells E and F.

Figure 9:
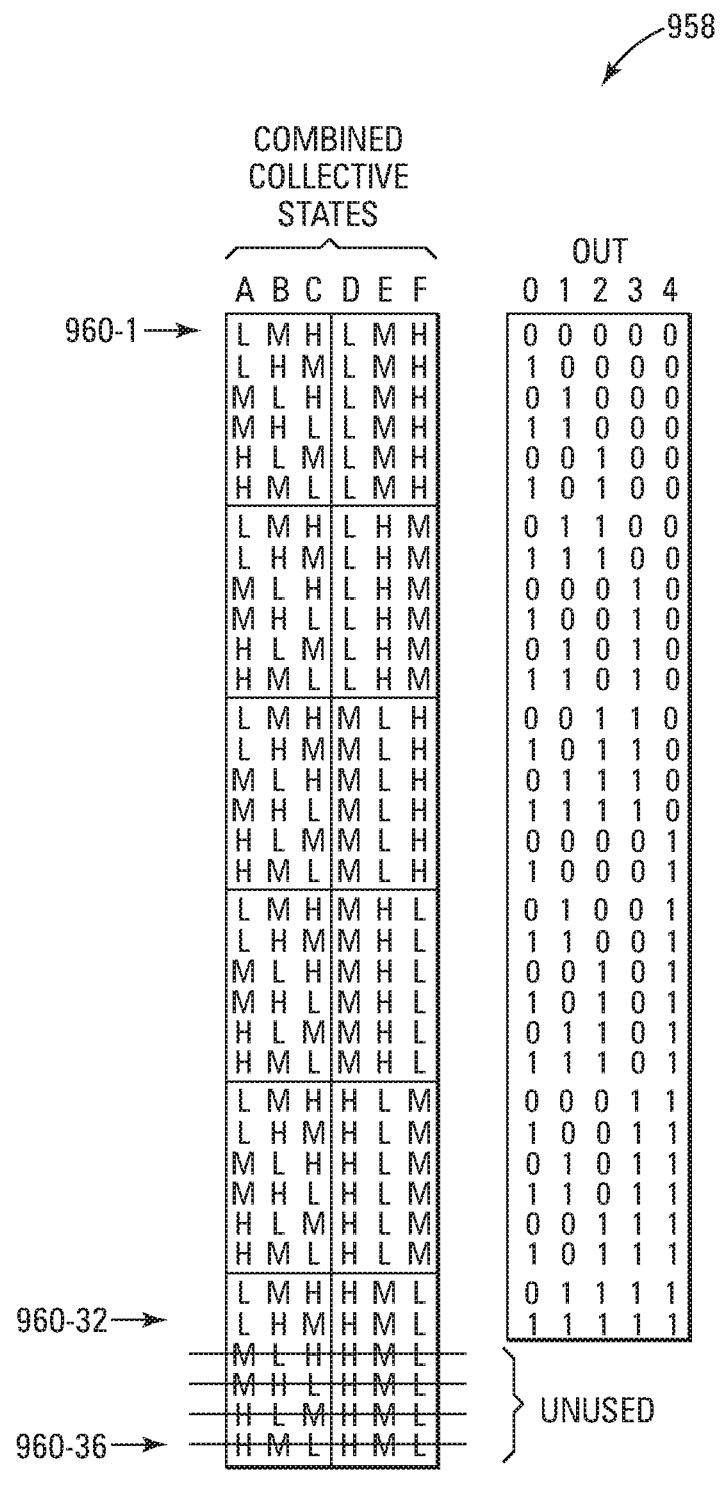

FIG. 9 illustrates a table 958 that associates the code output from combinatorial logic 833 and the combined collective states of two sets of three memory cells, such as the first set of memory cells A, B, and C and the second set of memory cells D, E, and F, in accordance with a number of embodiments of the present disclosure. For example, each respective row of rows 960-1 to 960-36 includes a respective combined collective state that includes a respective collective state of the first set of memory cells A, B, and C combined with a respective collective state of the second set of memory cells D, E, and F. Note that 32 of the 36 combined collective states are used, and each respective row of rows 960-1 to 960-32 includes a respective combined collective state (e.g., as an input to table 958) associated with a respective code (e.g., as an output of table 958).

In some examples, the coding described in conjunction with FIG. 9 may be used for 128 bits (e.g., a data bit page of 128 bits). For example, this may involve using sets (e.g., blocks) of six memory cells, including two sets of three cells in each set, so that each set corresponds to a code of five bits, as shown in FIG. 9. Therefore, for 128 bits, at least 26 of such sets may be required. The 26 sets include 156 memory cells for 130 bits with 0.83 bits/cell. In some examples, the extra two bits may be used to store metadata, such as a polarity bit and a parity bit for the data bit page.

The previous examples addressed two bits for one set three memory cells for a rate of 0.67 bit/cell and five bits for six memory cells (e.g., two sets of three cells) for a rate of 0.83 bit/cell. FIG. 10 illustrates bit/cell rates for various combinations of bits and memory cells, in accordance with a number of embodiments of the present disclosure. Note that 18 bits for 21 cells (e.g., seven sets of three cells) and 31 bits for 36 cells (e.g., 12 sets of three cells) give a bit rate of 0.86, the maximum bit rate for a set of three cells. Higher numbers of cells can, for example, require larger and more complex read components with larger more complex combinatorial logic and more sets of three comparators.

Figure 11:
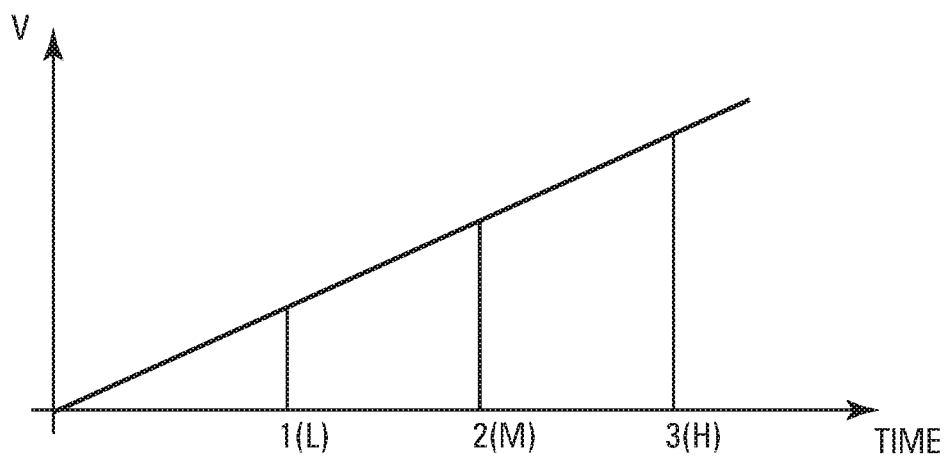
FIG. 11 illustrates a ramp voltage that may be applied to a group of memory cells, in accordance with a number of embodiments of the present disclosure.

FIG. 11 illustrates a ramp voltage V (e.g., increasing with time) that may be applied to access line 315 while a voltage (e.g., the same voltage) is applied concurrently to access 316-1 to 316-3 in FIG. 3, in accordance with a number of embodiments of the present disclosure. As such, a ramp voltage may be applied across (e.g., to) memory cells A, B, and C concurrently. The relative timewise order in which memory cells A, B, and C may experience a switching event in response to the ramp voltage depends on the relative states, such as the relative programmed resistances (e.g., the relative threshold voltages) of memory cells A, B, and C. A memory cell that experiences a switching event first, at the earliest relative time during the application of the ramp voltage (e.g., at time 1 in FIG. 11), may be at the lowest relative state L. A memory cell that experiences a switching event last, such as at the latest time (e.g., at time 3 in FIG. 11), may be at the highest relative state H. A memory cell that experiences a switching event at time between the times 1 and 3, such as at time 2 in FIG. 11, may be at medium relative state M.

Figure 12:
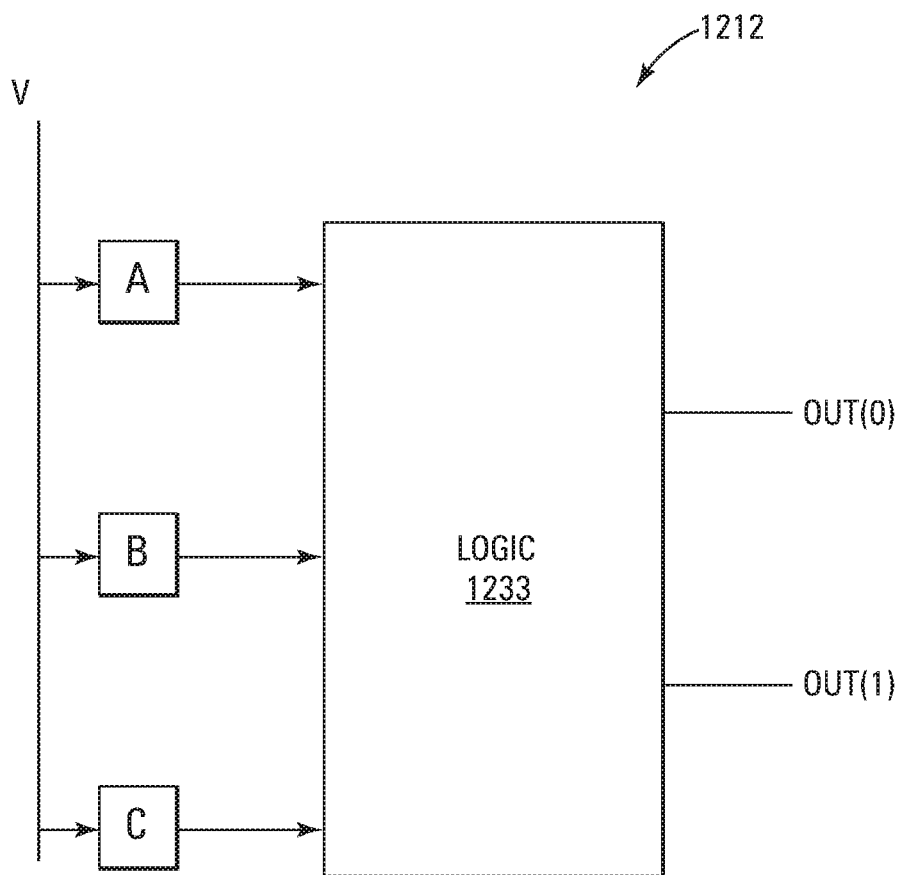
FIG. 12 illustrates an example of a reading component that may be used in conjunction with a ramp voltage, in accordance with a number of embodiments of the present disclosure.

A collective state of memory cells A, B, and C may be based on the relationship between the times memory cells A, B, and C experience a switching event may in response to the ramp voltage. For example, the collective state of memory cells A, B, and C may be based on the timewise order in which memory cells A, B, and C experience the switching events. FIG. 12 illustrates an example of a read component 1212 that may be used in conjunction with the ramp voltage in FIG. 11 and that may be a portion of read component 112 and/or read component 312, in accordance with a number of embodiments of the present disclosure. For example, logic 1233 may receive inputs in the relative timewise order in which memory cells A, B, and C experience a switching event. For example, the set of inputs may correspond to a relationship between the states of memory cells A, B, C based on the relative order in which memory cells A, B, and C experience a switching event. Logic 1233 may output a respective output Out(0) and Out(1) in response to respective input logic 1233, in which Out(0) and Out(1) respectively correspond to bits of a code corresponding to an input to logic 1233.

Figure 13:
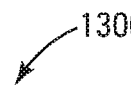
FIG. 13 a table that may be implemented in conjunction with a ramp voltage, in accordance with a number of embodiments of the present disclosure.

FIG. 13 is an example of a table 1370, such as a lookup table, that may be implemented by logic 1233, in accordance with a number of embodiments of the present disclosure. For example, the inputs to table 1370 may correspond to the inputs to logic 1233, and the outputs of table 1370 may correspond to the output of logic 1233, such as a code. The states L, M, and H in table 1370 correspond to the respective timewise order in which memory cells A, B, and C may experience a switching event. Note that memory cells A, B, and C may have six different collective states, of which four collective states are used in the example of FIG. 13.

Although the embodiments and examples previously described refer to sets of three memory cells (e.g., 3-cell sets) in which the assigned coding permutations comprise those permutations for which the three cells are each programmed to a different one of three possible states, the present disclosure is not so limited. For example, the present disclosure may be extended to include sets of cells comprising more than three memory cells each programmable to more than three different states. For example, a set can be a 4-cell set in which the assigned coding permutations comprise those permutations for which the four cells are each programmed to a different one of four possible states, among others.

In the preceding detailed description, reference is made to the accompanying drawings that form a part hereof, and in which is shown, by way of illustration, specific examples. In the drawings, like numerals describe substantially similar components throughout the several views. Other examples may be utilized and structural, logical and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
an array of memory cells each programmable to a plurality of states;
a controller coupled to the array and configured to determine an encoded data pattern stored by a number of groups of memory cells, wherein each of the number of groups comprises:
a set of memory cells programmed to one of a plurality of different collective state permutations each corresponding to a permutation in which the cells of the set are each programmed to a different one of the plurality of states to which they are programmable, wherein the controller is configured to determine the encoded data pattern by, for each of the number of groups, determining the one of the plurality of different collective state permutations to which the respective set is programmed by direct comparison of threshold voltages of the cells of the set, and wherein the controller is further configured to determine relationships between voltages corresponding to the set of memory cells to perform the direct comparison.

2. The apparatus of claim 1, wherein determining the one of the plurality of different collective state permutations to which the respective set is programmed by direct comparison of the threshold voltages of the cells of the set comprises determining the one of the plurality of different collective state permutations without applying multiple discreet reference voltages across the cells to distinguish between the plurality of states to which individual cells are programmable.

3. The apparatus of claim 1, wherein the set of memory cells of each of the number of groups comprises three cells each programmable to three distinct states.

4. The apparatus of claim 1, wherein each of the number of groups comprises multiple sets of memory cells, each set of the multiple sets being programmed to one of the plurality of different collective state permutations, and wherein the controller is configured to:
determine the encoded data pattern by, for each of the number of groups:
determining the ones of the plurality of different collective state permutations to which the respective multiple sets are programmed by direct comparison of threshold voltages of the cells of the set; and
combining the determined ones of the plurality of different collective state permutations to which the respective multiple sets are programmed to determine a combined collective state permutation corresponding to the respective multiple sets.

5. The apparatus of claim 4, wherein the number of groups of memory cells comprises at least two groups, and wherein each of the at least two groups stores a same quantity of bits of the encoded data pattern.

6. The apparatus of claim 4, wherein the controller is configured to, for each set of the multiple sets, perform direct comparison of threshold voltages of the cells of the respective set via a ramping voltage applied to a signal line to which the number of groups of memory cells are coupled.

7. The apparatus of claim 1, wherein the direct comparison of threshold voltages of the cells of the set is determined via a ramping voltage applied to a signal line to which the number of groups of memory cells are coupled.

8. The apparatus of claim 1, wherein the number of memory cells are read together as a group to determine the encoded data pattern.

9. An apparatus, comprising:
an array of memory cells; and
a controller coupled to the array and configured to:
determine a collective state of a set of memory cells, wherein each respective memory cell of the set is to be programmed to a different respective individual state, and
determine a relationship between the individual state of each respective memory cell in the set and the individual state of each other memory cell in the set to determine the collective state, wherein determining a relationship includes determining relationships between voltages of the memory cells,
wherein the controller is configured to determine a time at which a switching event occurs for each respective memory cell in the set relative to a time at which a switching event occurs for each other memory cell in the set.

10. The apparatus of claim 9, wherein the controller is configured to sense a difference between the individual state of each respective memory cell in the set and the individual state of each other memory cell in the set.

11. The apparatus of claim 9, wherein the controller is configured to sense a difference between a voltage corresponding to the individual state of each respective memory cell in the set and a voltage corresponding the individual state of each other memory cell in the set.

12. The apparatus of claim 9, wherein the controller is configured to encode the collective state in accordance with an assigned encoding.

13. The apparatus of claim 9, wherein the collective state is a first collective state and the set of memory cells is a first set of memory cells, wherein the controller is configured to:
determine a second collective state of a second set of memory cells;
combine the first collective state and the second collective state; and encode the combined first and second collective states with an assigned encoding.

14. A method, comprising:

determining an encoded data pattern stored by a number of groups of memory cells, wherein each of the number of groups comprises a set of memory cells programmed to one of a plurality of different collective state permutations each corresponding to a permutation in which the cells of the set are each programmed to a different one of the plurality of states to which they are programmable; and determining the encoded data pattern by, for each of the number of groups, determining the one of the plurality of different collective state permutations to which the respective set is programmed by direct comparison of threshold voltages of the cells of the set, wherein the direct comparison determines inequalities between the cells of the set.

15. The method of claim 14, further comprising determining the one of the plurality of different collective state permutations without applying multiple discreet reference voltages across the cells to distinguish between the plurality of states to which individual cells are programmable.

16. The method of claim 14, wherein each of the number of groups comprises multiple sets of memory cells, each set of the multiple sets being programmed to one of the plurality of different collective state permutations, wherein the method further comprises:

determining the encoded data pattern by, for each of the number of groups:

determining the ones of the plurality of different collective state permutations to which the respective multiple sets are programmed by direct comparison of threshold voltages of the cells of the set; and combining the determined ones of the plurality of different collective state permutations to which the respective multiple sets are programmed to determine a combined collective state permutation corresponding to the respective multiple sets.

17. The method of claim 16, further comprising, for each set of the multiple sets, performing direct comparison of threshold voltages of the cells of the respective set via a ramping voltage applied to a signal line to which the number of groups of memory cells are coupled.

18. The method of claim 14, wherein the number of memory cells are read together as a group to determine the encoded data pattern.

19. An apparatus, comprising:

an array of memory cells; and a controller coupled to the array and configured to:

determine a collective state of a set of memory cells, wherein each respective memory cell of the set is to be programmed to a different respective individual state, and determine a relationship between the individual state of each respective memory cell in the set and the individual state of each other memory cell in the set to determine the collective state, wherein determining a relationship includes determining relationships between voltages of the memory cells, wherein the collective state is a first collective state and the set of memory cells is a first set of memory cells, wherein the controller is configured to:

determine a second collective state of a second set of memory cells;

combine the first collective state and the second collective state; and encode the combined first and second collective states with an assigned encoding.

* * * * *